US012630920B2

(12) United States Patent
Pathak et al.

(10) Patent No.: US 12,630,920 B2
(45) Date of Patent: May 19, 2026

(54) SEMICONDUCTOR PROCESSING CHAMBERS AND METHODS FOR CLEANING THE SAME

(71) Applicant: Applied Materials, Inc., Santa Clara, CA (US)

(72) Inventors: Nitin Pathak, Mumbai (IN); Yuxing Zhang, San Jose, CA (US); Tuan A. Nguyen, San Jose, CA (US); Kalyanjit Ghosh, Pleasanton, CA (US); Amit Bansal, Milpitas, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 162 days.

(21) Appl. No.: 18/626,047

(22) Filed: Apr. 3, 2024

(65) Prior Publication Data

US 2024/0247371 A1     Jul. 25, 2024

Related U.S. Application Data

(62) Division of application No. 16/936,110, filed on Jul. 22, 2020, now Pat. No. 11,952,660.

(Continued)

(51) Int. Cl.
*C23C 16/44*          (2006.01)
*C23C 16/455*          (2006.01)
(Continued)

(52) U.S. Cl.
CPC ...... *C23C 16/4405* (2013.01); *C23C 16/4412* (2013.01); *C23C 16/45502* (2013.01);
(Continued)

(58) Field of Classification Search
CPC . C23C 16/4405; C23C 16/4412; C23C 16/52; C23C 16/4585; C23C 16/45502; H01J 37/32449; H01J 37/32862
See application file for complete search history.

(56) References Cited

U.S. PATENT DOCUMENTS 8,282,768 B1    10/2012  Smargiassi et al.
10,600,624 B2 *  3/2020  Ghosh ............... H01J 37/32834
(Continued)

FOREIGN PATENT DOCUMENTS

CN          103069560 A      4/2013
CN          103597119 A      2/2014
(Continued)

OTHER PUBLICATIONS

Application No. PCT/US2020/043197 , International Preliminary Report on Patentability, Mailed On Feb. 10, 2022, 12 pages.
(Continued)

*Primary Examiner* — Jeffrie R Lund
(74) *Attorney, Agent, or Firm* — Kilpatrick Townsend & Stockton LLP

(57) ABSTRACT

A processing chamber may include a gas distribution member, a substrate support, and a pumping liner. The gas distribution member and the substrate support may at least in part define a processing volume. The pumping liner may define an internal volume in fluid communication with the processing volume via a plurality of apertures of the pumping liner circumferentially disposed about the processing volume. The processing chamber may further include a flow control mechanism operable to direct fluid flow from the internal volume of the pumping liner into the processing volume via a subset of the plurality of apertures of the pumping liner during fluid distribution into the processing volume from the gas distribution member.

20 Claims, 8 Drawing Sheets

Related U.S. Application Data

(60) Provisional application No. 62/879,720, filed on Jul. 29, 2019.

(51) Int. Cl.
| | | |
|---|---|---|
| *C23C 16/458* | (2006.01) | |
| *C23C 16/52* | (2006.01) | |
| *H01J 37/32* | (2006.01) | |

(52) U.S. Cl.
CPC .......... *C23C 16/4585* (2013.01); *C23C 16/52* (2013.01); *H01J 37/32449* (2013.01); *H01J 37/32862* (2013.01)

(56) References Cited

U.S. PATENT DOCUMENTS

| | | | |
|---|---|---|---|
| 11,078,568 | B2 | 8/2021 | Ghosh et al. |
| 11,952,660 | B2 | 4/2024 | Pathak et al. |
| 2010/0139556 | A1 | 6/2010 | Kagami et al. |
| 2012/0009765 | A1 | 1/2012 | Olgado |
| 2015/0056108 | A1 | 2/2015 | Gytri et al. |
| 2015/0275357 | A1 | 10/2015 | Kamakura et al. |
| 2019/0122872 | A1* | 4/2019 | Ghosh ................. C23C 16/4408 |
| 2020/0216952 | A1 | 7/2020 | Ghosh et al. |
| 2021/0032747 | A1 | 2/2021 | Pathak et al. |
| 2022/0119948 | A1 | 4/2022 | Lee et al. |
| 2023/0265560 | A1 | 8/2023 | Ramamurthi et al. |
| 2024/0247371 | A1* | 7/2024 | Pathak ................ C23C 16/4405 |

FOREIGN PATENT DOCUMENTS

| | | | |
|---|---|---|---|
| CN | 104425315 | A | 3/2015 |
| CN | 104952683 | A | 9/2015 |
| CN | 105164788 | A | 12/2015 |
| JP | 2001525495 | A | 12/2001 |
| JP | 2004006733 | A | 1/2004 |
| JP | 2007524236 | A | 8/2007 |
| JP | 2015183271 | A | 10/2015 |
| KR | 20090086374 | A | 8/2009 |
| KR | 20150111812 | A | 10/2015 |
| TW | 201221684 | A | 6/2012 |
| TW | 202113128 | A | 4/2021 |
| WO | 2009017322 | A1 | 2/2009 |
| WO | 2012015931 | A2 | 2/2012 |

OTHER PUBLICATIONS

Application No. PCT/US2020/043197 , International Search Report and Written Opinion, Mailed On Oct. 30, 2020, 16 pages.
Singapore Application No. 11202200328P, Notice of Decision to Grant mailed on Dec. 23, 2025, 4 pages.

* cited by examiner

400

SEMICONDUCTOR PROCESSING CHAMBERS AND METHODS FOR CLEANING THE SAME

CROSS-REFERENCE TO RELATED APPLICATIONS

The present application is a divisional of U.S. Non-Provisional patent application Ser. No. 16/936,110, filed Jul. 22, 2020, which claims the benefit of, and priority to U.S. Provisional Patent Application No. 62/879,720, filed Jul. 29, 2019, the contents of which are hereby incorporated by reference in their entirety for all purposes.

TECHNICAL FIELD

The present technology relates to semiconductor processes and equipment. More specifically, the present technology relates to semiconductor processing chambers and methods for cleaning the same.

BACKGROUND

Integrated circuits are made possible by processes which produce intricately patterned material layers on substrate surfaces. As device sizes continue to shrink in next-generation devices, uniformity of processing conditions continues to increase in importance, and chamber designs and system set-up may have an important role in the quality of devices produced. Thus, there is a need for systems and methods that can be used to produce high quality devices and structures.

SUMMARY

According to one aspect, a processing chamber may include a gas distribution member and a substrate support positioned below the gas distribution member. The gas distribution member and the substrate support may at least in part define a processing volume. The gas distribution member may provide fluid access into the processing volume. The processing chamber may further include a pumping liner disposed radially outward from the substrate support. The pumping liner may define a plurality of apertures circumferentially disposed about the processing volume and an internal volume that may be in fluid communication with the processing volume via the plurality of apertures. The pumping liner may further define a gas inlet disposed radially outward from the plurality of apertures. The gas inlet may provide fluid access into the internal volume of the pumping liner. The processing chamber may further include a flow control mechanism. The flow control mechanism may be operable to direct fluid flow into the internal volume via the gas inlet and then into the processing volume via a subset of the plurality of apertures of the pumping liner during fluid distribution into the processing volume from the gas distribution member.

In some embodiments, the flow control mechanism may include a first choke plate and a second choke plate disposed inside the pumping liner. The first choke plate and the second choke plate may divide the internal volume of the pumping liner into a first volume and a second volume. The first volume may be in fluid communication with the processing volume via one half of the plurality of apertures. The second volume may be in fluid communication with the processing chamber via the other half of the plurality of apertures. The flow control mechanism may be operable to direct fluid flow from the first volume into the second volume via the processing volume.

In some embodiments, the flow control mechanism may include a valve disposed downstream of a gas outlet and upstream of an exhaust. The valve may be operable to close to prevent fluid flow from the processing chamber or the internal volume of the pumping liner to the exhaust via the gas outlet.

In some embodiments, the gas outlet may be a first gas outlet. The valve may be a first valve. The flow control mechanism may further include a second gas outlet and a second valve disposed downstream of the second gas outlet and upstream of the exhaust. The gas inlet may be a first gas inlet. The pumping liner may further define a second gas inlet. The second valve may be operable to close to direct fluid flow into the internal volume via the second gas inlet and then into the processing volume via another subset of the plurality of apertures during fluid distribution into the processing volume from the gas distribution member.

In some embodiments, the flow control mechanism may be operable to create a pressure differential between a pressure inside a first duct coupling a first gas outlet to an exhaust and a pressure inside a second duct coupling a second gas outlet to the exhaust.

In some embodiments, the pumping liner may include a first internal baffle and a second internal baffle diametrically opposed from each other. In some embodiments, the first baffle may be disposed between the gas inlet and the plurality of apertures.

In some embodiments, the pumping liner may include a first portion defining a first laterally extending volume portion of the internal volume of the pumping liner. The gas inlet may be disposed at an upper surface of the first portion. The pumping liner may further include a second portion defining a second laterally extending volume portion of the internal volume of the pumping liner. The first laterally extending volume portion and the second laterally extending volume portion may be diametrically opposed from each other. The pumping liner may further include a third portion defining a first toroidally shaped volume portion of the internal volume of the pumping liner. The first toroidally shaped volume portion may be disposed between the first laterally extending volume portion and the second laterally extending volume portion. The pumping liner may further include a fourth portion defining a second toroidally shaped volume portion of the internal volume of the pumping liner. The first toroidally shaped volume portion and the second toroidally shaped volume portion may be diametrically opposed from each other.

In some embodiments, the gas inlet may be a first gas inlet. The pumping liner may further define a second gas inlet disposed at an upper surface of the second portion. The flow control mechanism may be further operable to direct fluid flow into the internal volume of the pumping liner via the second gas inlet and then into the processing volume via another subset of the plurality of apertures of the pumping liner during fluid distribution into the processing volume from the gas distribution member.

In some embodiments, the processing chamber may further include an annular gap around the substrate support to provide fluid access from a lower portion of the processing chamber to the processing volume and the internal volume of the pumping liner. In some embodiments, each aperture of the plurality of apertures may be disposed at an equal distance from adjacent two apertures of the plurality of apertures.

According to another aspect, a method for cleaning a processing chamber may include flowing a first gas through a gas distribution member of a processing chamber into a processing volume defined at least in part by the gas distribution member and a substrate support of the processing chamber. The method may further include flowing a second gas through a gas inlet of a pumping liner of the processing chamber into an internal volume of the pumping liner. The pumping liner may be disposed radially outward from the substrate support. The internal volume may be in fluid communication with the processing volume via a plurality of apertures of the pumping liner circumferentially disposed about the processing volume. The method may further include flowing a portion of the second gas from the internal volume of the pumping liner into the processing volume through a first subset of apertures of the plurality of apertures while maintaining the flow of the first gas into the processing volume. The method may further include flowing the portion of the second gas from the processing volume into the internal volume of the pumping liner via a second subset of apertures of the plurality of apertures.

In some embodiments, the interval volume of the pumping liner may include a first volume and a second volume separated by a pair of choke plates. Flowing the second gas through the gas inlet of the pumping liner into the internal volume of the pumping liner may include flowing the second gas through the gas inlet of the pumping liner into the first volume. Flowing the portion of the second gas from the internal volume of the pumping liner into the processing volume may include flowing the portion of the second gas from the first volume into the processing volume. The portion of the second gas may be distributed throughout the entire processing volume. Flowing the portion of the second gas from the processing volume into the internal volume of the pumping liner may include flowing the portion of the second gas from the processing volume into the second volume.

In some embodiments, the first gas may be distributed throughout the entire processing volume at a substantially uniform concentration. In some embodiments, the first gas may be flowed at a first flow rate. The second gas may be flowed at a second flow rate greater than the first flow rate.

In some embodiments, the gas inlet may be a first gas inlet, the method may further include stop flowing the second gas through the first gas inlet of the pumping liner into the internal volume of the pumping liner. The method may further include flowing a third gas through a second gas inlet of the pumping liner into the internal volume of the pumping liner. The method may further include flowing a portion of the third gas from the internal volume of the pumping liner into the processing volume through the second subset of apertures of the plurality of apertures. The method may further include flowing the portion of the third gas from the processing volume into the internal volume of the pumping liner via the first subset of apertures of the plurality of apertures.

In some embodiments, the method may further include flowing a third gas through an annular gap surrounding the substrate support in an upward direction toward the processing volume.

According to another aspect, a deposition method may include flowing a first gas through a gas distribution member of a processing chamber into a processing volume defined at least in part by the gas distribution member and a substrate support of the processing chamber supporting a semiconductor substrate thereon. The deposition method may further include flowing a second gas through a gas inlet of a pumping liner of the processing chamber into an internal volume of the pumping liner. The pumping liner may be disposed radially outward from the substrate support. The internal volume of the pumping liner may be in fluid communication with the processing volume via a plurality of apertures circumferentially disposed about the processing volume. The first gas may be flowed at a first flow rate. The second gas may be flowed at a second flow rate less than the first flow rate such that the first gas may be flowed from the processing volume into the internal volume of the pumping liner via the plurality of apertures while the flow of the second gas into the processing volume may be substantially prevented. A pressure difference between two peripheral locations inside the processing volume may be less than 0.001 torr.

In some embodiments, the gas inlet may be a first gas inlet, and the deposition method may further include flowing a third gas through a second gas inlet of the pumping liner into the internal volume of the pumping liner. The first gas inlet and the second gas inlet may be diametrically opposed from each other. The third gas may be flowed at a third flow rate less than the first flow rate such that the flow of the third gas into the processing volume may be substantially prevented. The flow of the first gas, the flow of the second gas, and the flow of the third gas may collectively create an axially symmetrical pressure profile inside the processing volume about a central axis of the processing volume.

In some embodiments, the deposition method may further include flowing a third gas through an annular gap surrounding the substrate support in an upward direction toward the processing volume.

The present technology may provide numerous benefits over conventional systems and techniques. For example, the present technology may clean the processing chamber significantly faster than conventional in-situ cleaning methods, and thus improve production throughput. The present technology may also clean the processing chamber in a substantially uniform manner. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
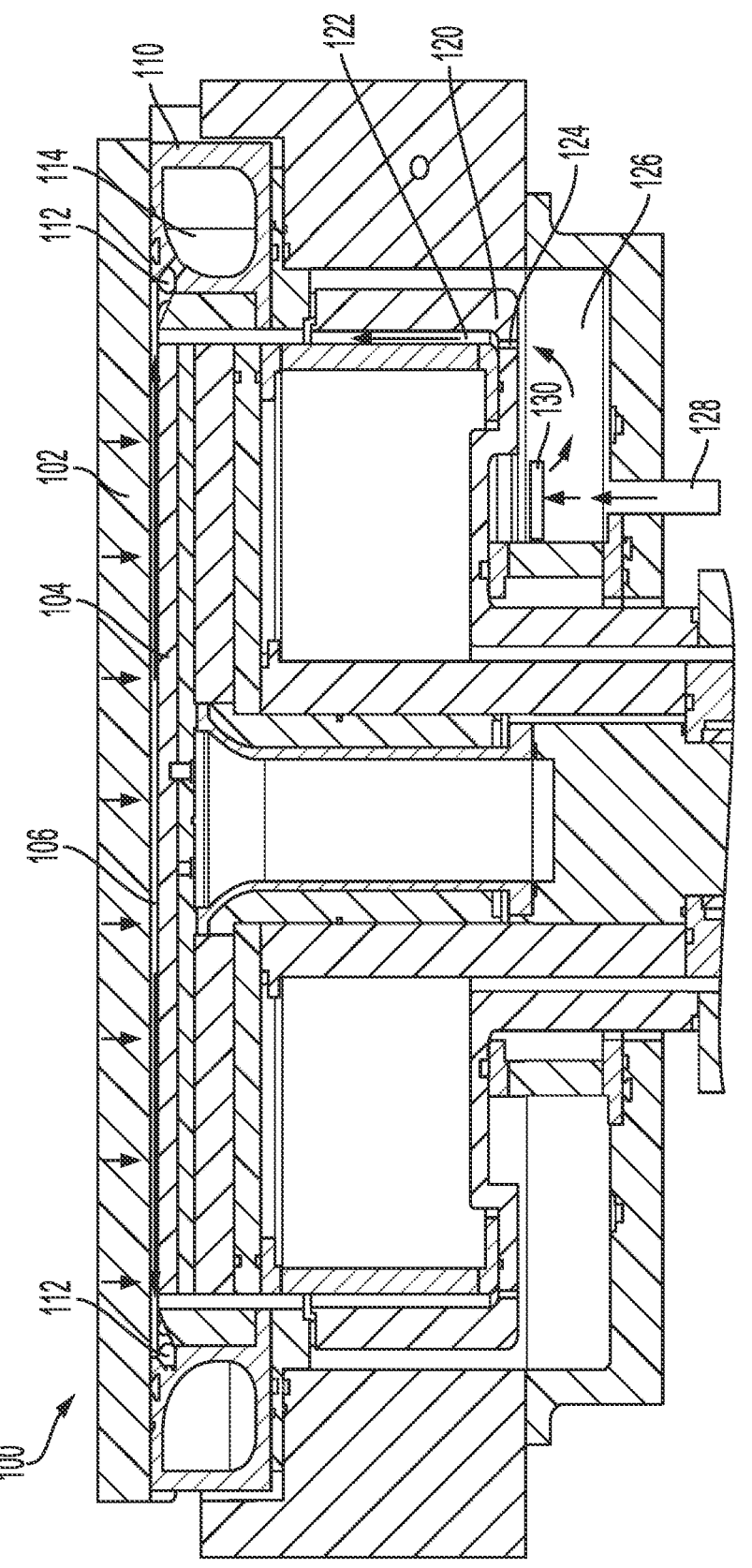
FIG. 1 shows a schematic cross-sectional view of an exemplary processing chamber according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During manufacturing of semiconductor devices, a wafer may be delivered into a processing volume of a semiconductor processing chamber for carrying out one or more deposition processes, such as one or more chemical vapor deposition processes. During deposition, the materials, e.g., one or more deposition gases, to be deposited on the wafer may also be deposited on the surfaces of various chamber components exposed to the deposition gas. Thus, the processing chamber may be cleaned from time to time. Conventional chamber designs may utilize an in-situ cleaning method where a cleaning gas may be delivered into the processing chamber in a manner similar to how the deposition gas may be delivered into the processing volume. Thus, the in-situ cleaning gas may clean the various chamber components defining the processing volume and the chamber components upstream of the processing volume. However, such in-situ cleaning may not sufficiently clean the various chamber components downstream of the processing volume, or may require a significant amount of time for the downstream components to be sufficiently cleaned, which can reduce production throughput.

The present technology overcomes these issue by utilizing an ex-situ cleaning gas that may be delivered through a bypass gas inlet of a pumping liner of the processing chamber. The ex-situ cleaning gas may be delivered concurrently with the in-situ cleaning gas. The present technology may further utilize one or more flow control mechanisms to regulate the flow the ex-situ cleaning gas such that the ex-situ cleaning gas may effectively clean the processing volume, as well as various chamber components downstream of the processing volume. By performing the ex-situ cleaning in lieu of or in addition to the in-situ cleaning, the entire processing chamber may be cleaned efficiently, and production throughput may be improved.

Although the remaining disclosure will routinely identify various fluid flows for cleaning of a processing chamber utilizing the disclosed technology, the technology should not be considered to be so limited as for cleaning process only. The present technology can be utilized for other processes, including but not limited to deposition, etching, etc., where regulated and/or uniform fluid flow may be beneficial. Moreover, although exemplary semiconductor processing chambers are described to aid understanding of the present technology, the technology should not be considered to be so limited as for cleaning components of semiconductor processing chambers only or to the exemplary chamber described. It is to be understood that the present technology can be utilized for any type of processing chamber.

FIG. 1 shows a schematic cross-sectional view of an exemplary processing chamber 100 according to embodiments of the present technology. The processing chamber 100 may include a gas distribution member or showerhead 102 and a substrate support 104 positioned below the gas distribution member 102. The gas distribution member 102 and the substrate support 104 may at least in part define a processing volume 106. The gas distribution member 102 may include a number of apertures configured to provide fluid access into the processing volume 106. The top component of the substrate support 104 may be or include a heater that may be configured to support and heat a substrate or wafer that may be placed on a top surface of the substrate support 104 during processing. The processing chamber 100 may further include a pumping liner 110 disposed radially outward from the substrate support 104. The pumping liner 110 may define a number of apertures 112 circumferentially disposed about the processing volume 106. The pumping liner 110 may further define an internal volume 114 that may be in fluid communication with the processing volume 106 via the apertures 112.

In some embodiments, the substrate support 104 may be housed inside a bottom bowl 120, and a gap 122, which may be annular, may be formed between the substrate support 104 and the bottom bowl 120 to allow the substrate support 104 to move up and down inside the bottom bowl 120. To limit or prevent a process gas, such as a deposition gas which may be delivered into the processing volume 106 from the gas distribution member 102, from flowing downward below the top surface of the substrate support 104 and entering into the lower portion of the processing chamber 100 through the gap 122, a purge gas, which may include an inert gas, such as argon, nitrogen, etc., may be flowed into the gap 122 in an upward direction toward the processing volume 106.

In some embodiments, the purge gas may be delivered into a purge volume 126 through a purge inlet 128 at the bottom of the processing chamber 100. A purge baffle 130 may be disposed adjacent the purge inlet 128 to deflect the flow of the purge gas to facilitate the distribution of the purge gas throughout the purge volume 126. In some embodiments, the processing chamber 100 may include a single purge inlet 128 and a single purge baffle 130. In some embodiments, the processing chamber 100 may include multiple purge inlets 128 and a corresponding number of purge baffles 130. The purge gas may then enter into the gap 122 through a number of purge equalizer holes 124 defined in the bottom bowl 120 and flow upward toward the processing volume 106. The purge gas and the process gas may then be combined at an outer periphery of the processing volume 106 and removed by the pumping liner 110 through the apertures 112. In some embodiments, the purge equalizer holes 124 may have a common size. In some embodiments, the purge equalizer holes 124 may have a variable size. For example, depending on the location of the purge equalizer holes 124 relative to the purge inlet 128, the purge equalizer holes 124 closer to the purge inlet 128 may have a smaller diameter than the purge equalizer holes 124 further away from the purge inlet 128. By distributing the purge gas throughout the purge volume 126 and flowing the purge gas through the purge equalizer holes 124 of appropriate sizes, an azimuthally uniform purge gas flow may be achieved, which may further promote a uniform deposition profile on a wafer.

Figure 2:
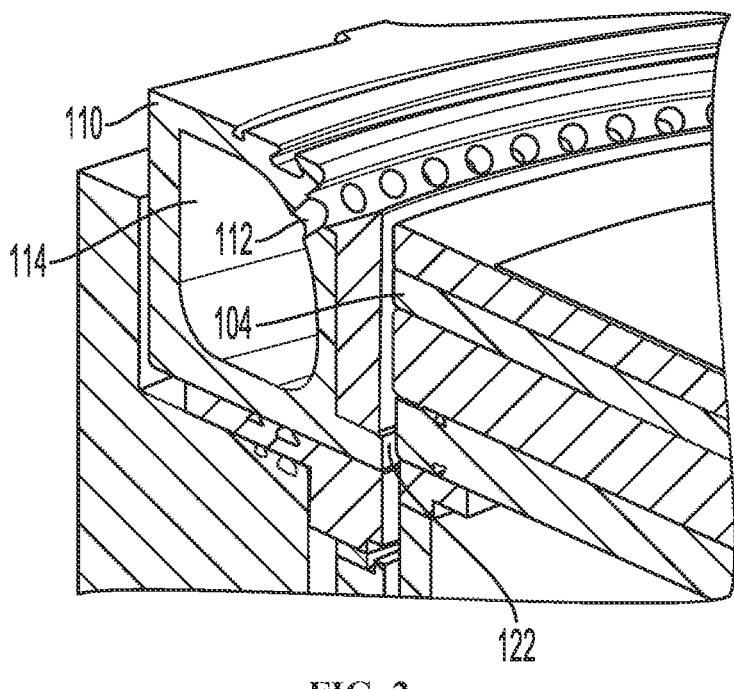
FIG. 2 schematically illustrates select chamber components of the processing chamber of FIG. 1.

FIG. 2 schematically illustrates a perspective cross-sectional view of portions of select components of the processing chamber 100 to better illustrates the configuration of the select components. As shown, the apertures 112 of the pumping liner 110 may be circumferentially disposed around an inner periphery of the pumping liner 110 and may be spaced apart from each other at an equal distance. The purge gas may be flowed through the gap 122 upward and mixed with the process gas near the edge or periphery of the substrate support 104, and flowed from the processing volume 106 (not shown in FIG. 2) into the internal volume 114 of the pumping liner 110 through the apertures 112.

Figure 3:
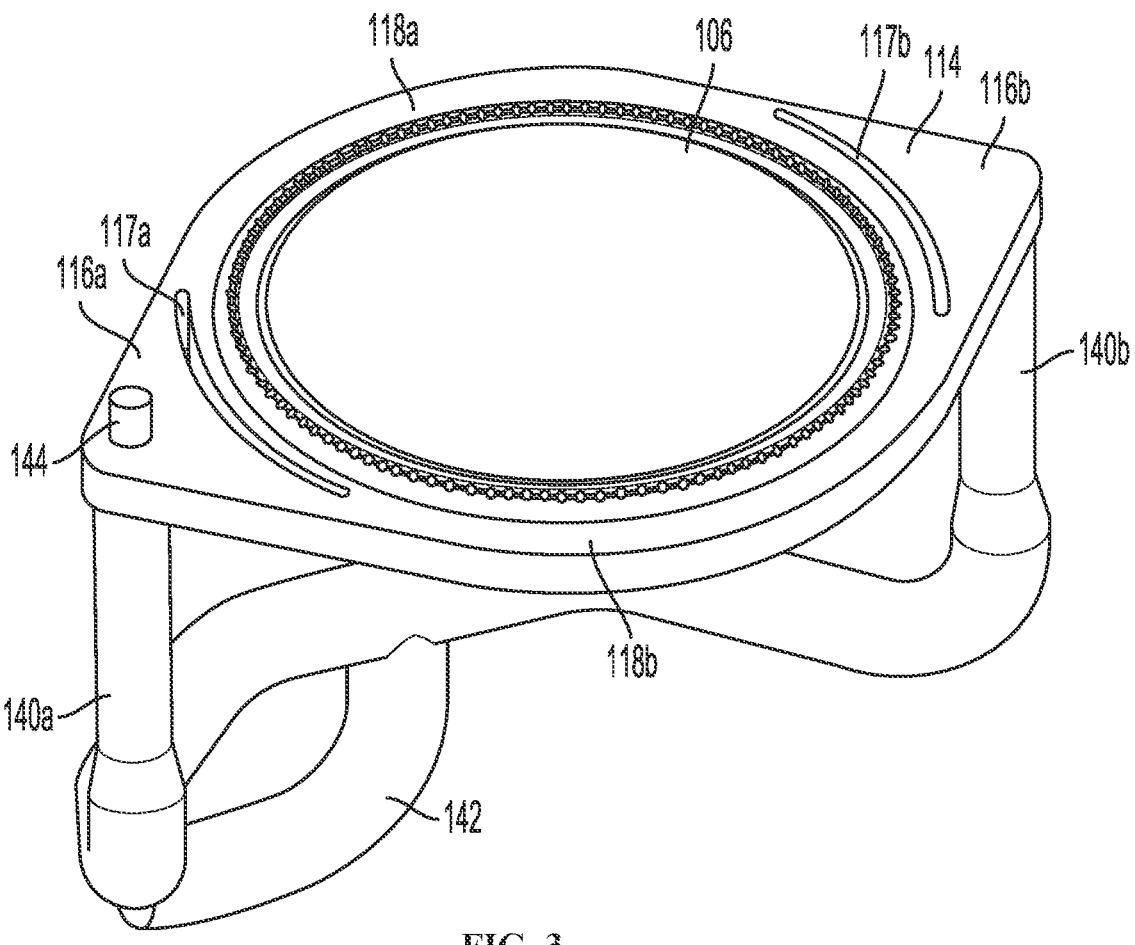
FIG. 3 schematically illustrates a right perspective view of one or more flow volumes defined by select chamber components of the processing chamber of FIG. 1.

FIG. 3 schematically illustrates a right perspective view of one or more flow volumes defined by select chamber components of the processing chamber 100 of FIG. 1. It should be noted that the flow volumes illustrated in FIG. 3 and other subsequent flow volume illustrations may only represent the internal volumes or interior shapes of the various chamber components defining the one or more flow volumes. Thus, for each chamber components described herein, the exterior shape or form may vary from embodiment to embodiment, depending on how the chamber component may be integrated into the processing chamber 100 and/or be coupled with other chamber components and various other considerations, although the internal volume or interior shape may be the same. Further, for purpose of discussion, certain chamber components may be described by referencing to the flow volume illustrations, although the actual chamber components may not be illustrated in the flow volume illustrations.

With continued reference to FIG. 3, the flow volumes may include the processing volume 106 defined by a bottom surface of the gas distribution member 102 and the top surface of the substrate support 104, and the internal volume 114 of the pumping liner 110 fluidly coupled to the processing volume 106 via the apertures 112 of the pumping liner 110. The flow volumes may further include one or more foreline volumes 140 fluidly coupled with and downstream of the internal volume 114 of the pumping liner 110. In some embodiments, a first foreline volume 140a may be coupled with a first laterally extending volume portion 116a of the internal volume 114 of the pumping liner 110, and a second foreline volume 140b may be coupled with a second laterally extending volume portion 116b of the internal volume 114 of the pumping liner 110. The flow volumes may further include an exhaust volume 142 fluidly coupled with and downstream of the first and second foreline volumes 140a, 140b. Each of the foreline volumes 140a, 140b may be defined by a foreline coupled to an gas outlet of the pumping liner 110. The exhaust volume 142 may be defined by an exhaust duct that may direct fluid flow towards an exhaust of the processing chamber 100.

The internal volume 114 of the pumping liner 110 may include the first laterally extending volume portion 116a and the second laterally extending volume portion 116b. The internal volume 114 of the pumping liner 110 may further include two toroidally shaped volume portions 118a, 118b or a first toroidally shaped volume portion 118a and a second toroidally shaped volume portion 118b. The two toroidally shaped volume portions 118a, 118b may each be disposed between the two laterally extending volume portions 116a, 116b. The two laterally extending volume portions 116a, 116b may be diametrically opposed from each other, and the toroidally shaped volume portions 118a, 118b may also be diametrically opposed from each other.

In some embodiments, the laterally extending volume portions 116a, 116b may be defined by two liner portions of the pumping liner 110 that may also extend laterally, and the toroidally shaped volume portions 118a, 118b may be defined by two liner portions of the pumping liner 110 that may also each have a toroidal shape. However, as already mentioned above, the respective liner portions defining the toroidally shaped or laterally extending volume portions 116a, 116b, 118a, 118b may not have the corresponding or similar exterior shape or form in some embodiments.

As shown in FIG. 3, the internal volume 114 of the pumping liner 110 may have an axis of symmetry passing through the middle of each of the two toroidally shaped volume portions 118a, 118b and another axis of symmetry passing through the middle of each of the two laterally extending volume portions 116a, 116b. The laterally extending volume portions 116a, 116b may be greater than the toroidally shaped volume portions 118a, 118b as the corresponding liner portions may be sized and shaped to allow the pumping liner 110 to be supported by other chamber components and/or to define one or more gas inlets and gas outlets for upstream and/or downstream fluid communication with other flow volumes of the processing chamber 100.

To promote a uniform fluid flow profile inside the processing volume 106, and to minimize any effect the non-axisymmetric shape of the internal volume 114 of the pumping liner 110 or the gas inlets and outlets at the liner portions defining the lateral extending volume portions 116a, 116b may have on the fluid flow profile inside the processing volume 106, in some embodiments, the pumping liner 110 may include a pair of curved baffles disposed in the liner portions defining the laterally extending volume portions 116a, 116b. The two baffles are shown as two gaps 117a, 117b in FIG. 3 as there may be no fluid flow through the baffles.

During deposition, a process gas, such as a single gas or a gas mixture, may be flowed into the processing volume 106 from the gas distribution member 102. The excess of the process gas may then be flowed into the internal volume 114 of the pumping liner 110 through the apertures 112 of the pumping liner 110, and then flowed downstream through the foreline volumes 140a, 140b and various other downstream flow volumes towards the exhaust of the processing chamber 100. Deposition may occur on the surfaces of the various chamber components exposed to the flow of the process gas.

Upon completion of one or more deposition processes, the processing chamber 100 may be cleaned by flowing into the various flow volumes a cleaning gas to remove any material deposition on the various chamber component surfaces. The cleaning gas may include a single gas or a gas mixture. In some embodiments, the cleaning gas may include plasma effluents that may be generated in a remote plasma source or unit fluidly coupled to the processing chamber 100 and then flowed into the processing chamber 100. In some embodiments, the plasma effluents may be generated locally in the processing chamber 100, such as a capacitively coupled plasma generated inside the processing chamber 100. During the cleaning of the processing chamber 100, the purge gas may be continuously flowed from the bottom portion of the processing chamber 100 into the processing chamber 100 via the annular gap 122 as discussed above with reference to FIG. 1 to limit or prevent the cleaning gas from flowing below the substrate support 104.

In some embodiments, the cleaning gas may be flow into the processing chamber 100 in a manner similar to how the process gas may be flowed into the processing chamber 100 during the deposition process. Specifically, the cleaning gas may be flowed into processing volume 106 through the gas distribution member 102, which may then be flowed into the internal volume 114 of the pumping liner 110 and through various downstream flow volumes toward the exhaust of the processing chamber 100. Thus, the same components and/or surfaces exposed to the process gas may also be exposed to and thus cleaned by the cleaning gas. Cleaning the processing chamber 100 by flowing the cleaning gas through the gas distribution member 102 into the processing volume 106 as described above may also be referred to as in-situ cleaning. The in-situ cleaning gas may effectively clean the various chamber components upstream of the processing volume 106. However, the time associated with an in-situ cleaning cycle to sufficiently clean the chamber components downstream of the processing volume 106 may be long, affecting production throughput.

In some embodiments, to shorten the cleaning time or cleaning cycle, ex-situ cleaning may be utilized. As shown in FIG. 3, in some embodiments, the flow volumes may further include a bypass volume 144 fluidly coupled with the internal volume 114 of the pumping liner 110. The bypass volume 144 may be defined by a bypass duct coupled to a bypass gas inlet, or simply gas inlet, of the pumping liner 110. The gas inlet may be disposed on an upper surface of the liner portion defining one of the laterally extending volume portions 116a, 116b. The bypass volume 144 and the gas inlet or bypass inlet of the pumping liner 110 may allow a cleaning gas to be delivered into the internal volume 114 of the pumping liner 110 and various other flow volumes (as will be discussed in more detail below) to clean the processing chamber 100, while bypassing the gas distribution member 102. The cleaning gas delivered via the bypass volume 144 may include a single gas or a gas mixture and may include plasma effluents. The plasma effluents may be generated using a remote plasma source or remote plasma unit, and then provided into the processing chamber 100 through the bypass volume 144 and the gas inlet of the pumping liner 110 for cleaning the processing chamber 100. Cleaning the processing chamber 100 by flowing a cleaning gas through the bypass gas inlet of the pumping liner 110 into the processing chamber 100 may be referred to as ex-situ cleaning.

Figure 4:
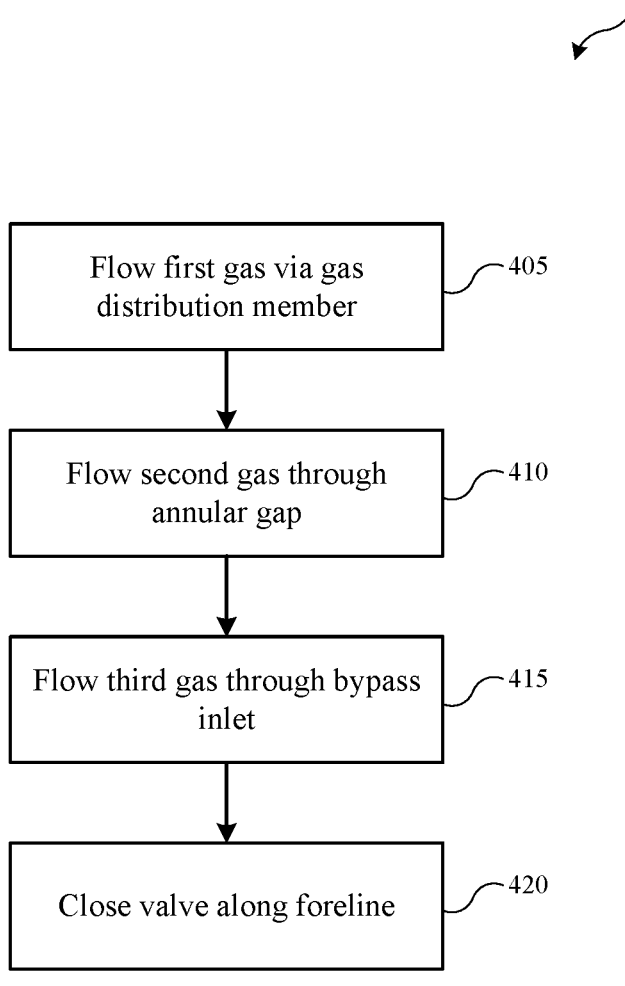
FIG. 4 shows exemplary operations in a method of cleaning chamber components of a processing chamber according to embodiments of the present technology.
Figure 5A:
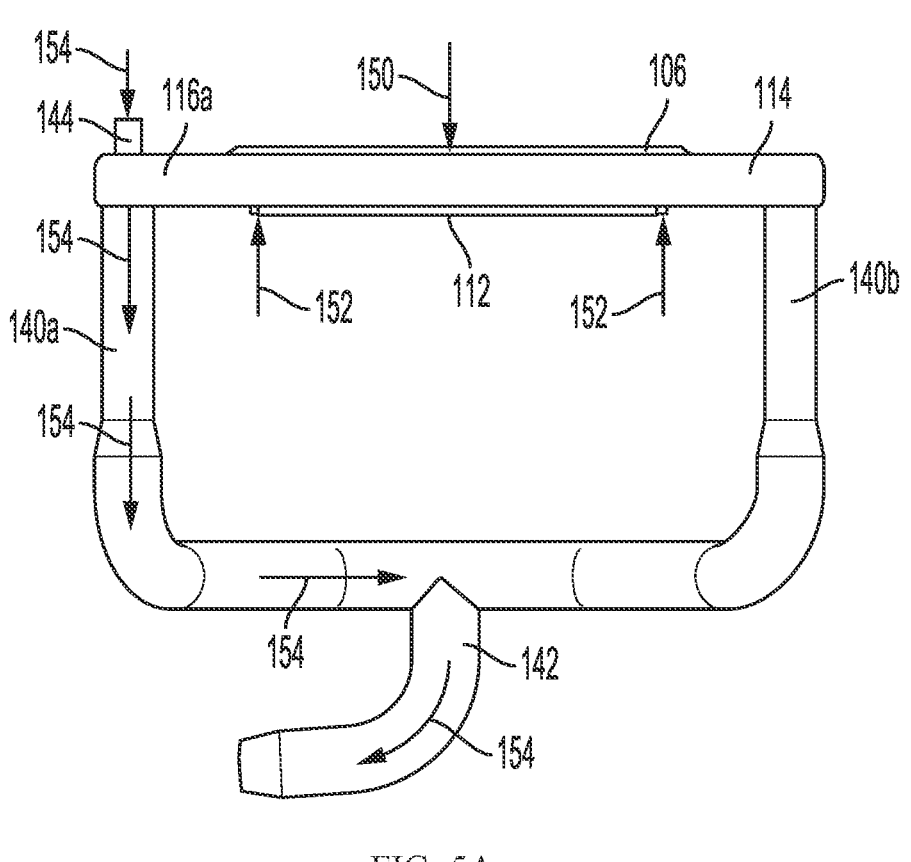
FIGS. 5A and 5B schematically illustrate flow volumes of a processing chamber while one or more operations of method of FIG. 4 may be performed.
Figure 5B:
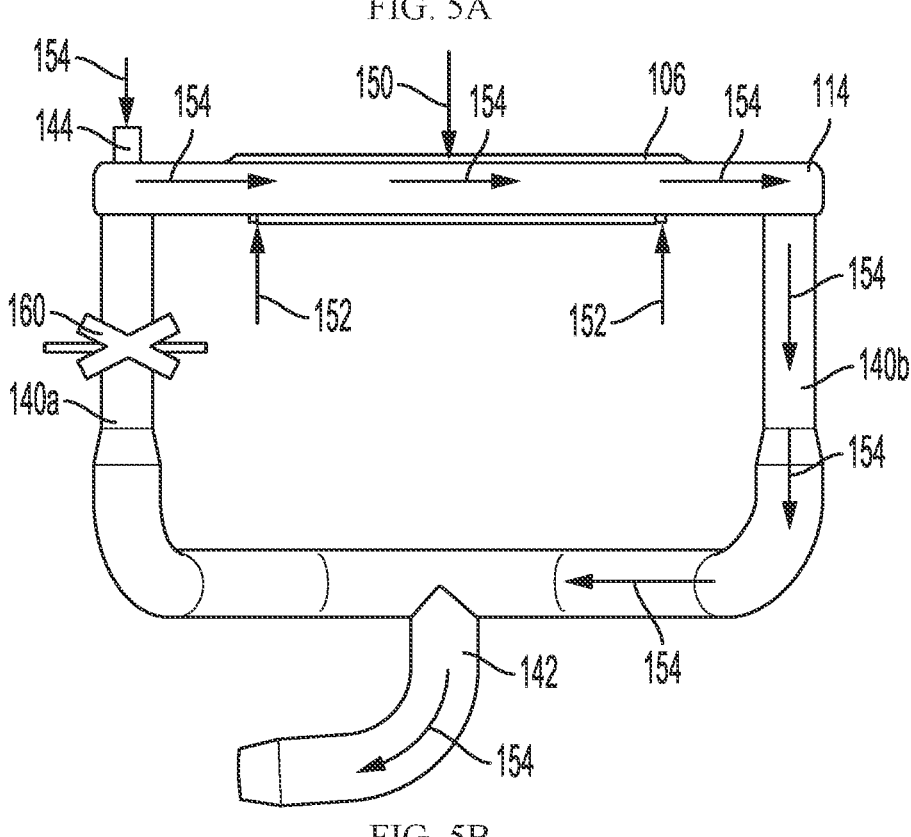

FIG. 4 shows exemplary operations in a method 400 utilizing ex-situ cleaning to clean chamber components downstream of the processing volume 106. FIGS. 5A and 5B schematically illustrate method 400. Specifically, similar to FIG. 3, FIGS. 5A and 5B schematically illustrate the flow volumes defined by the various chamber components. FIG. 5A schematically illustrates a front view of the flow volumes shown in FIG. 3 while one or more operations of the downstream cleaning method 400 may be performed. FIG. 5B schematically illustrates the same front view as FIG. 5A while one or more other operations of the downstream cleaning method 400 may be performed. A portion of the purge gas flow volume or the annular gap 122 shown in FIG. 1 is also shown in FIGS. 5A and 5B. The various operations of method 400 may be performed in any order and may be removed or modified.

Method 400 may begin by flowing a first or in-situ cleaning gas 150 into the processing volume 106 via the gas distribution member 102 at operation 405, flowing a second gas 152 through the gap 122 surrounding the substrate support 104 in an upward direction toward the processing volume 106 at operation 410, and flowing a third or ex-situ cleaning gas 154 into the internal volume 114 of the pumping liner 110 from the bypass volume 144 via the bypass gas inlet of the pumping liner 110 at operation 415.

The first gas flow 150 may be or include a cleaning gas flow, or more specifically, an in-situ cleaning gas flow for carrying out the in-situ cleaning of various chamber components. The first gas flow 150 may be continuously delivered into the processing volume 106 through the gas distribution member 102. Thus, the ex-situ cleaning and the in-situ cleaning may be carried out concurrently in method 400. In some embodiments, even when in-situ cleaning may not be conducted, the first gas flow 150 may still be maintained by flowing an inert gas through the gas distribution member 102 into the processing volume 106 so as to prevent any of the third gas flow 154 delivered through the bypass volume 144 from entering into chamber volumes upstream of the gas distribution member 102.

The second gas flow 152, which may be or include a purge gas flow and may be similar to or the same as the purge gas flow delivered during deposition, may also be maintained so as to prevent any of the first gas flow 150 and the third gas flow 154 from entering into the lower portion of the processing chamber 100. The third gas flow 154, which may be or include a cleaning gas flow, or more specifically, an ex-situ cleaning gas flow for carrying out the ex-situ cleaning of various chamber components. The third gas flow 154 may be continuously delivered into the internal volume 114 of the pumping liner 110 from the bypass volume 144 via the bypass gas inlet of the pumping liner 110.

With reference to FIG. 5A, with the first, second, and third gases 150, 152, 154 being flowed concurrently, a majority portion or substantially all of the third gas 154 may simply pass through the laterally extending volume portions 116a of the internal volume 114 of the pumping liner 110 and enter the first foreline volume 140a below the first laterally extending volume portion 116a of the internal volume 114 of the pumping liner 110. The third gas flow 154 may then enter into the exhaust volume 142 and flow toward the exhaust of the processing chamber 100. Thus, the third gas flow 154 may clean the various ducts defining the first foreline volume 140a and the exhaust volume 142 and other downstream chamber components. However, because the third gas flow 154 may bypass substantially the entire internal volume 114 of the pumping liner 110, as well as the second foreline volume 140b, the pumping liner 110 and the duct defining the second foreline volume 140b may not be cleaned.

To clean the pumping liner 110, in some embodiments, the processing chamber 100 may include a flow control mechanism, such as a valve 160, disposed along the foreline duct to regulate the flow of the third gas flow 154. For example, the valve 160 may be configured to open or close to allow or prevent the third gas flow 154 through the first foreline volume 140a, which may in turn force the third gas flow 154 to flow through the internal volume 114 of the pumping liner 110 and the second foreline volume 140b. Thus, at operation 420, the valve 160 may be closed. As shown in FIG. 5B, the third gas flow 154 into the first foreline volume 140a may then be prevented, and the third gas flow 154 may be forced to enter into the internal volume 114 of the pumping liner 110 and to flow through the second foreline volume 140b towards exhaust, cleaning the pumping liner 110, the foreline duct defining the second foreline volume 140*b*, and other downstream chamber components.

In some embodiments, instead of or in addition to the valve 160, other device or mechanism may be implemented to direct the third gas flow 154 towards the internal volume 114 and the second foreline volume 140*b*. For example, a pressure deferential between the two foreline volumes 140*a*, 140*b* may be created to direct the third gas flow 154 towards the second foreline volume 140*b* via the internal volume 114 of the pumping liner 110. Specifically, mechanisms may be implemented to increase the pressure inside the first foreline volume 140*a* such that the pressure inside the first foreline volume 140*a* may be greater than the pressure inside the second foreline volume 140*b*. For example, another gas flow may be created along the duct defining the first foreline volume 140*a* to direct a gas flow into the second foreline volume 140*b* thereby increasing the pressure therein. The pressure differential may force the third gas flow 154 to flow through the internal volume 114 of the pumping liner 110 and the second foreline volume 140*b* to clean the pumping liner 110, the duct defining the second foreline volume 140*b*, and other various downstream chamber components. In some embodiments, a pressure differential of at least about 0.5 torr, at least about 1 torr, at least about 1.5 torr, at least about 2 torr, at least about 2.5 torr, at least about 3 torr, at least about 3.5 torr, at least about 4 torr, or greater may be created and/or maintained.

By performing the operations of method 400, various chamber components downstream of the processing volume 106, such as the pumping liner 110, downstream ducts, etc., may be cleaned by the ex-situ cleaning gas flow 154. During the ex-situ cleaning, some of the third gas flow 154 may enter into the processing volume 106 from the internal volume 114 via some of the apertures 112 of the pumping liner 110, depending on the mechanism implemented to direct the flow of the third gas 154 into the internal volume 114 of the pumping liner 110. Thus, some of the chamber components defining the processing volume 106 may also be cleaned by the third gas flow 154. However, the concentration of the third gas flow 154 inside the processing volume 106 may be low and the third gas flow 154 may not be distributed throughout the entire processing volume 106.

For example, when the valve 160 may be closed, only a very small amount of the third gas 154 may flow into the processing volume 106 via a small number of the apertures 112 of the pumping liner 110 due to the flow of the first gas flow 150 and the second gas flow 152 from the processing volume 106 toward the internal volume 114 of the pumping liner 110. Further, the third gas flow 154 may only reach the peripheral region of the processing volume 106 near the bypass volume 144 and may not reach the central region of the processing volume 106 or the peripheral region of the processing volume 106 further away from the bypass volume 144.

When the pressure differential between the first foreline volume 140*a* and the second foreline volume 140*b* may be created by increasing the pressure inside the first foreline volume 140*a*, the third gas 154 may be flowed into the processing volume 106 via more apertures 112 of the pumping liner 110 and distributed inside the processing volume 106 at a higher concentration. However, the distribution of the third gas 154 in the processing volume 106 may not be uniform. For example, the concentration of the third gas 154 in regions of the processing volume 106 near the baffles of the pumping liner 110 may be lower than other regions of the processing volume 106. Thus, the various chamber components defining the processing volume 106 may not be uniformly cleaned by the ex-situ cleaning gas 154 or may require very long cleaning time to ensure all material deposition on the various chamber components may be removed, which may reduce production throughput.

Figures 6A, 6B:
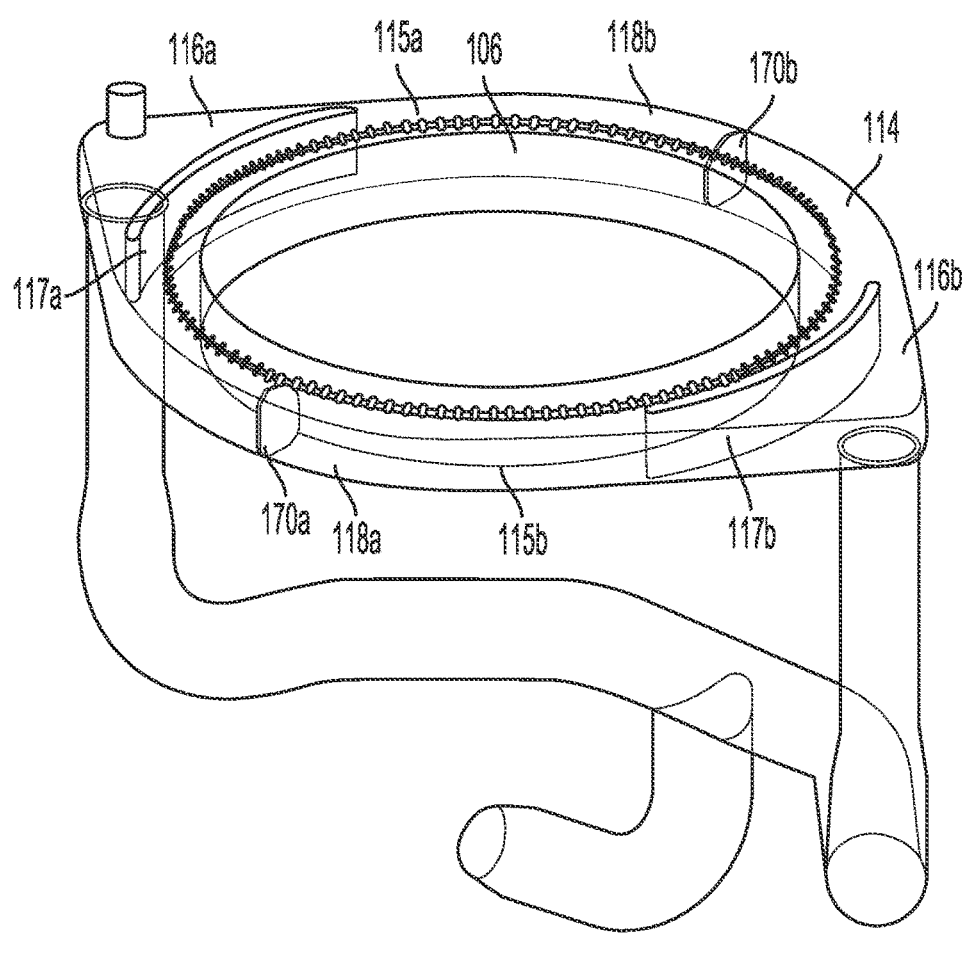
FIGS. 6A and 6B schematically illustrates a left perspective view and a partial plan view, respectively, of flow volumes of a processing chamber, incorporating a flow control mechanism accordingly embodiments of the present technology.

FIG. 6A schematically illustrates a left perspective view of the flow volumes of the processing chamber 100, incorporating a flow control mechanism that may increase the third gas flow 154 into the processing volume 106. FIG. 6B illustrates a partial plan view of the flow volumes of the processing chamber 100, incorporating the flow control mechanism. As shown, the flow control mechanism may include a pair of choke plates 170*a*, 170*b*, or a first choke plate 170*a* and a second choke plate 170*b*. Each of the choke plates 170*a*, 170*b* may be disposed in the middle of one of the toroidally shaped volume portions 118*a*, 118*b* of the internal volume 114 of the pumping liner 110. Thus, the internal volume 114 may be divided into two smaller volumes or two sub-volumes, e.g., a first substrate-volume 115*a* and a second sub-volume 115*b*. The first sub-volume 115*a* may include the first laterally extending volume portion 116*a* and a portion, e.g., one half, of each of the first and second toroidally shaped volume portions 118*a*, 118*b*. The second sub-volume 115*b* may include the second laterally extending volume portion 116*b* and the remaining portion, e.g., the other half, of each of the first and second toroidally shaped volume portions 118*a*, 118*b*. The choke plates 170*a*, 170*b* may be oriented perpendicular to the baffles of the pumping liner 110. Specifically, the baffles may extend circumferentially, as shown by the extension of the flow gaps 117*a*, 177*b* created by the baffles in FIGS. 6A and 6B, whereas the choke plates 170*a*, 170*b* may extend radially, thus may be perpendicular to the baffles.

The choke plates 170*a*, 170*b* may interrupt or prevent the fluid flow directly from the first sub-volume 115*a* to the second sub-volume 115*b*, or vice versa. The fluid access from the first sub-volume 115*a* to the second sub-volume 115*b*, or vice versa, may be established via the apertures 112 of the pumping liner 110 and the processing volume 106. Specifically, one half of the apertures 112 may provide fluid access between the first sub-volume 115*a* and the processing volume 106, and the other half of the apertures 112 may provide fluid access between the second sub-volume 115*b* and the processing volume 106. By preventing direct fluid flow from the first sub-volume 115*a* to the second sub-volume 115*b* or vice versa, the ex-situ cleaning gas 154 may be forced to enter into the processing volume 106 after entering into the first sub-volume 115*a*, and then may be forced to enter into the second sub-volume 115*b* from the processing volume 106, as illustrated in FIG. 6B.

Thus, when the various operations of method 400 may be performed, i.e., flowing the first gas flow 150, the second gas flow 152, and the third gas flow 154 and closing the valve 160, the third gas 154 may enter into the first laterally extending volume portion 116*a* and one half of each of the toroidally shaped volume portions 118*a*, 118*b* to clean half of the pumping liner 110, and then enter into the processing volume 106 via one half of the apertures 112 to clean the chamber components, e.g., the gas distribution member 102 and substrate support 104, defining the processing volume 106. The third gas flow 154 may then enter into the other half of each of the toroidally shaped volume portions 118*a*, 118*b* and the second laterally extending volume portion 116*b* to clean the other half of the pumping liner 110.

As shown in FIGS. 6A and 6B, the choke plates 170*a*, 170*b* may be placed in the middle of the toroidally shaped volume portions 118*a*, 118*b*, and thus divide the apertures 112 of the pumping liner 110 into equal number of apertures 112 for establishing fluid access between the first sub-volume 115a and the processing volume 106 and for establishing fluid access between the second sub-volume 115b and the processing volume 106. Thus, the apertures 112 may be symmetrically distributed on either side of each of the choke plates 170a, 170b to facilitate equal flow distribution. The choke plates 170a, 170b may also divide each of the toroidally shaped volume portions 118a, 118b into equal halves. Such equal division may facilitate creating and/or maintaining a uniform flow profile inside the processing volume 106 during the deposition and/or cleaning process. By placing the choke plates 170a, 170b in the middle of the toroidally shaped volume portions 118a, 118b, the third gas flow 154 may also be forced to flow through all of the apertures 112 establishing the fluid access between the first sub-volume 115a and the processing volume 106 and to flow through all of the apertures 112 establishing the fluid access between the processing volume 106 and the second sub-volume 115b, and the third gas 154 may be distributed throughout the entire processing volume 106.

Moreover, as compared to the concentration of the third gas flow 154 inside the processing volume 106 when no choke plates 170a, 170b may be utilized, the concentration of the third gas 154 inside the processing volume 106 may be significantly higher by incorporating the choke plates 170a, 170b into the pumping liner 110, and the concentration of the third gas 154 may be substantially uniform throughout the processing volume 106. In some embodiments, the concentration of the third gas 154 inside the pumping liner 110 and/or the processing volume 106 may be greater than or about 104 ppm, greater than or about 105 ppm, greater than or about 106 ppm, or greater. Thus, effective cleaning of the pumping liner 110 and the various chamber components defining the processing volume 106 may be achieved efficiently.

Due to the presence of the choke plates 170a, 170b, in some embodiments, there may be substantially no first gas flow 150 or second gas flow 152 in the first sub-volume 115a of the pumping liner 110 when the first gas 150 may be flowed. Thus, the mass fraction of the third gas 154 in the first sub-volume 115a of the pumping liner 110 may be at least about 90%, at least about 95%, or up to 100% when the various operations of method 400 may be performed. The mass fraction of the third gas 154 in the second sub-volume 115b may be at least about 60%, at least about 65%, at least about 70%, at least about 75%, at least about 80%, at least about 85%, at least about 90%, at least about 95%, or higher. Although due to the presence of the first gas flow 150 and/or the second gas flow 152 in the second sub-volume 115b, the mass fraction of the third gas 154 in the second sub-volume 115b may be less than the mass fraction of the third gas 154 in the first sub-volume 115a, the concentration of the third gas 154 in the second sub-volume 115b of the pumping liner 110 may nonetheless be very high, and may be greater than or about $10^4$ ppm, greater than or about $10^5$ ppm, greater than or about $10^6$ ppm, or greater for effectively cleaning. Thus, by incorporating the choke plates 170a, 170b into the pumping liner 110, effective and efficient cleaning of the various chamber components defining the processing volume 106, as well as other downstream chamber components, e.g., pumping liner 110, ducts defining the foreline volumes 140a, 140b, the exhaust volume 142, etc., can be achieved.

In some embodiments, each of the choke plates 170a, 170b may be a separate component that can be placed into the internal volume 114 of the pumping liner 110. In some embodiments, the pumping liner 110 may be made by assembling an upper part having a downward-facing opening and a lower part having an upward-facing opening matching the downward-facing opening of the upper part. The choke plates 170a, 170b may be placed inside or incorporated into one of the upper part or the lower part prior to the assembly. In some embodiments, the pumping liner 110 may be made by assembling a left part or left half and a right part or right half together. The left part may define the first laterally extending volume portion 116a and half of each of the toroidally shaped volume portions 118a, 118b, and the right part may define the second laterally extending volume portion 116b and half of each of the toroidally shaped volume portions 118a, 118b. At least one of the left part or the right part may include closed ends defining one half of the toroidally shaped volume portions 118a, 118b. Thus, when the left and right parts may be assembled, the toroidally shaped volume portions 118a, 118b may be divided by the closed ends, which may effectively function as the choke plates 170a, 170b described above. Various other ways of incorporating the choke plates 170a, 170b into the pumping liner 110 may be implemented.

The choke plates 170a, 170b may have a thickness ranging between about 0.2 mm and about 4 mm, between about 0.5 mm and about 3.5 mm, between about 1 mm and about 3 mm, between about 1.5 mm and about 2.5 mm. The thickness of each of the choke plates 170a, 170b may be about 0.5 mm, about 1 mm, about 1.5 mm, about 2 mm, about 2.5 mm, about 3 mm, about 3.5 mm, or about 4 mm. The choke plates 170a, 170b may be made of the same material as the pumping liner 110, which may include aluminum, alumina, and any other suitable chamber component materials, depending on the particular application. Although two choke plates 170a, 170b are described as an example, more than two choke plates 170 may be utilized based on various other considerations. Further, depending on the application and various other considerations, the two or more choke plates may be placed at any other locations to regulate the gas flow, in addition to or in lieu of the middle of the toroidally shaped volume portions 118a, 118b.

The first gas 150, or the in-situ cleaning gas, may be a single gas or a gas mixture and/or may include plasma effluents having radicals of the in-situ cleaning gas. In some embodiments, the plasma may be generated in a remote plasma source or unit fluidly coupled with the processing chamber 100 and then flowed into the processing volume 106 of the processing chamber 100. In some embodiments, the plasma effluents may be generated locally in the processing chamber 100, such as a capacitively coupled plasma generated inside the processing volume 106. As discussed above, since in some embodiments, the processing volume 106 may be cleaned by the third gas 154, or the ex-situ cleaning gas, the first gas 150 may not be a cleaning gas that may actively react with the material deposition on the chamber components. The first gas 150 may simply include one or more inert gases, e.g., nitrogen or a noble gas, to prevent the backflow of the ex-situ cleaning gas 154 into the upstream components of the processing chamber 100.

The second gas 152 may include a single gas or a gas mixture that may be inert and unreactive with the material deposition on the chamber components or other gases delivered into the processing chamber 100. The second gas 152 may be or include nitrogen, one or more of the noble gases, e.g., helium, neon, argon, krypton, xenon, and radon, and the like. The third gas 154, or the ex-situ cleaning gas, may be a single gas or a gas mixture and/or may include plasma effluents having radicals of the ex-situ cleaning gas. The plasma may be generated in a remote plasma source or unit and then flowed into the processing chamber 100 via the bypass volume 144. In some embodiments, the third gas 154 may include oxygen or oxygen radicals, although any other suitable cleaning gas may be utilized, depending on the material deposition to be removed from the various chamber components.

During the various processes described herein, including the deposition, in-situ cleaning, and/or ex-situ cleaning, the operating pressure of the processing chamber 100 may be maintained between about 1 torr and about 10 torr, or may be maintained at about 2 torr, about 4 torr, about 6 torr, about 8 torr, or about 10 torr. In some embodiments, the operating pressure may be maintained generally at the same or similar levels during different processes. In some embodiments, the operating pressure may vary from process to process.

Depending on the process, the flow rates of the various gas flows, e.g., the first gas flow 150, the second gas flow 152, and/or the third gas flow 154 may vary from process to process. During ex-situ cleaning, the second gas flow 152 may be maintained at a level greater than the first gas flow 150, and the third gas flow 154 may be maintained at a level greater than the second gas flow 152.

In some embodiments, during ex-situ cleaning, the first gas flow 150 may be maintained at a level greater than or about 200 sccm, greater than or about 300 sccm, greater than or about 400 sccm, greater than or about 500 sccm, greater than or about 600 sccm, greater than or about 700 sccm, greater than or about 800 sccm, greater than or about 900 sccm, greater than or about 1000 sccm, greater than or about 1100 sccm, greater than or about 1200 sccm, greater than or about 1300 sccm, greater than or about 1400 sccm, greater than or about 1500 sccm, or greater.

In some embodiments, during ex-situ cleaning, the second gas flow 152 may be maintained at a level greater than or about 1500 sccm, greater than or about 2000 sccm, greater than or about 2500 sccm, greater than or about 3000 sccm, greater than or about 3500 sccm, greater than or about 4000 sccm, or greater. The third gas flow 154 may be maintained at a level greater than or about 4000 sccm, greater than or about 4500 sccm, greater than or about 5000 sccm, greater than or about 5500 sccm, greater than or about 6000 sccm, greater than or about 6500 sccm, greater than or about 7000 sccm, greater than or about 7500 sccm, greater than or about 8000 sccm, or greater.

In some embodiments, during ex-situ cleaning, a ratio of the flow rate of the first gas 150 to the flow rate of the third gas 154 may range between 1:5 and 1:15, or may be about 1:5, about 1:6, about 1:7, about 1:8, about 1:9, about 1:10, about 1:11, about 1:12, about 1:13, about 1:14, about 1:15, or less. A ratio of the flow rate of the second gas 152 to the flow rate of the third gas 154 may range between 1:2 to 1:5, or may be about 1:2, about 1:3, about 1:4, about 1:5, or less.

During deposition, the flow of the third gas 154 may be continuously maintained to prevent the deposition gas from flowing into the bypass volume 144 and other chamber volumes upstream of the bypass volume 144. Because the valve 160 may be opened during deposition, substantially all of the third gas flow 154 may flow from the bypass volume 144 through a small region of the first laterally extending volume portion 116a of the internal volume 114 of the pumping liner 110 and then into the first foreline volume 140a. Substantially no or very limited amount of the third gas flow 154 may flow beyond the baffle or enter into the volume of pumping liner 110 behind the baffle or the processing volume 106. Nonetheless, the third gas flow 154 may be maintained at a relatively low level as compared to that during the ex-situ cleaning so as to limit any amount of the third gas 154 that may be present in the processing volume 106 and to limit any effect the third gas flow 154 may have on the pressure and flow profile of the deposition gas in the processing volume 106.

In some embodiments, during deposition, the third gas flow 154 may be maintained less than or about 600 sccm, less than or about 500 sccm, less than or about 400 sccm, less than or about 300 sccm, less than or about 200 sccm, less than or about 100 sccm, less than or about 75 sccm, less than or about 50 sccm, or less, while effectively limiting or preventing the deposition gas from entering into the bypass volume 144 and other chamber volumes upstream of the bypass volume 144. A ratio of the flow rate of the third gas 154 to the first gas 150 may range between 1:5 and 1:100, or may be about 1:5, about 1:8, about 1:10, about 1:20, about 1:30, about 1:40, about 1:50, about 1:60, about 1:80, about 1:100, or less. A ratio of the flow rate of the third gas 154 to the flow rate of the second gas 152 may range between 1:2 to 1:50, or may be about 1:2, about 1:4, about 1:8, about 1:10, about 1:15, about 1:20, about 1:30, about 1:40, about 1:50, or less. By maintaining the third gas flow 154 at a relatively low level, the concentration of the third gas 154 in the processing volume 106, if any, may be less than 4 ppm, less than 3 ppm, less than 2 ppm, less than 1 ppm, less than 0.5 ppm, less than 0.1 ppm, or less.

In some embodiments, depending on the flow rates of the first gas 150, the second gas 152, and/or the third gas 154, a minor or minimal pressure skew may be observed in the processing volume 106 along the direction perpendicular to the orientation of the choke plates 170a, 170b. In other words, the pressure profile may not be entirely concentric or axially symmetric inside the processing volume 106 about a central axis of the processing volume 106.

Figure 7:
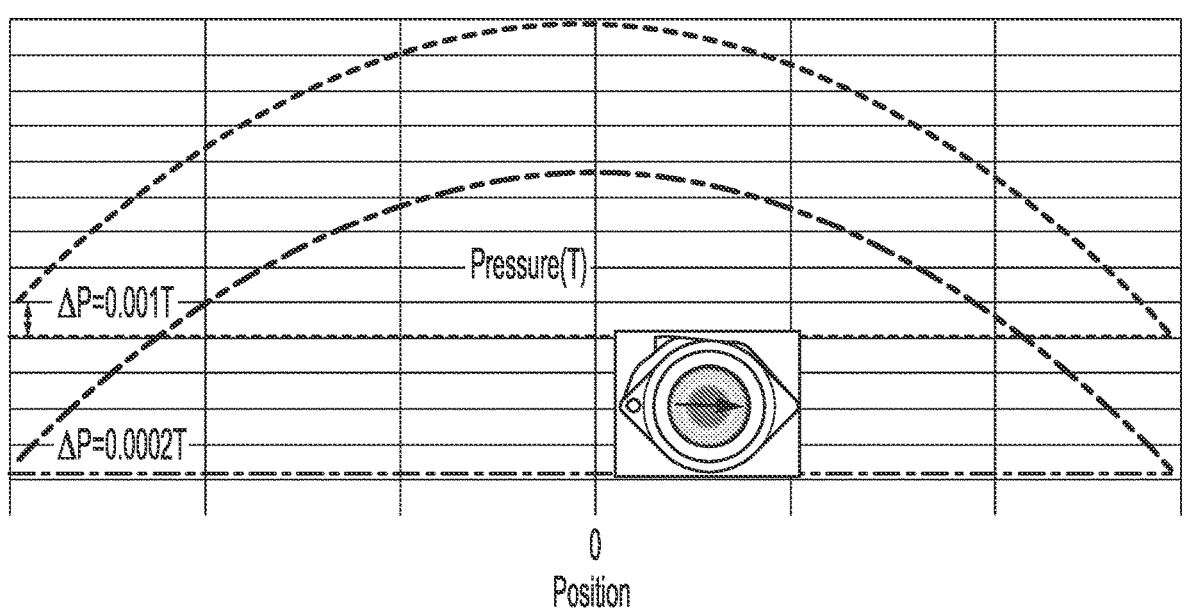
FIG. 7 schematically illustrates pressure profiles inside a processing volume of a processing chamber accordingly embodiments of the present technology.

FIG. 7 schematically illustrates pressure profiles inside the processing volume 106 for different flow rates of the third gas 154. For example, when the third gas 154 may be flowed at 500 sccm, a pressure skew or pressure difference of about 0.001 torr or less may be observed at two peripheral locations of the processing volume 106 along the direction perpendicular to the orientation of the choke plates 170a, 170b. When the third gas 154 may be flowed at 100 sccm, a pressure skew or pressure difference of about 0.0002 torr or less at the same two peripheral locations along the direction perpendicular to the orientation of the choke plates 170a, 170b. Depending on the particular application, such pressure differential may be negligible.

Figure 8:
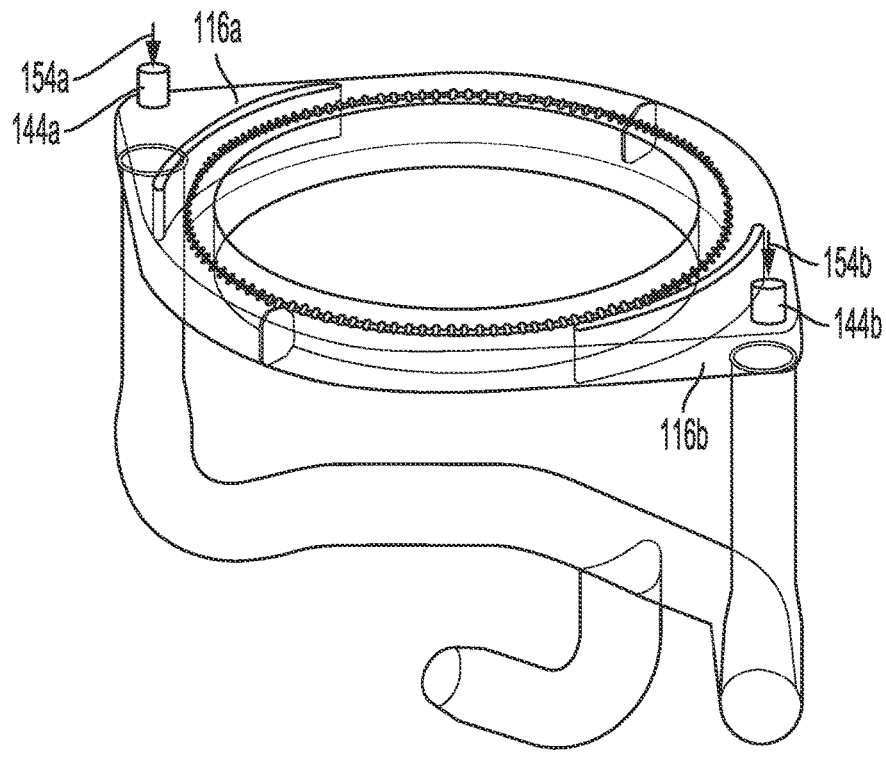
FIG. 8 schematically illustrates flow volumes of a processing chamber according to embodiments of the present technology.

To eliminate any pressure skew that may be created due to the third gas flow 154, two bypass flows may be created as shown in FIG. 8. As discussed above, the pumping liner 110 includes a bypass gas inlet, or a first bypass gas inlet, for providing fluid access from the bypass volume 144, or the first bypass volume 144a shown in FIG. 8, into the first laterally extending volume portion 116a of the pumping liner 110. In the embodiment shown in FIG. 8, the pumping liner 110 may further include a second bypass gas inlet for providing fluid access from a second bypass volume 144b into the second laterally extending volume portion 116b. The third gas 154 may be flowed simultaneously into the first laterally extending volume portion 116a through the first bypass volume 144a and into the second laterally extending volume portion 116b through the second bypass volume 144b at a common flow rate, such as any of the range or level of the flow rate of the third gas flow 154 discussed above. The concurrent flow 154a, 154b of the third gas 154 may facilitate creation and/or maintaining of a concentric or axially symmetric pressure profile inside the processing volume 106 during deposition.

Figure 9:
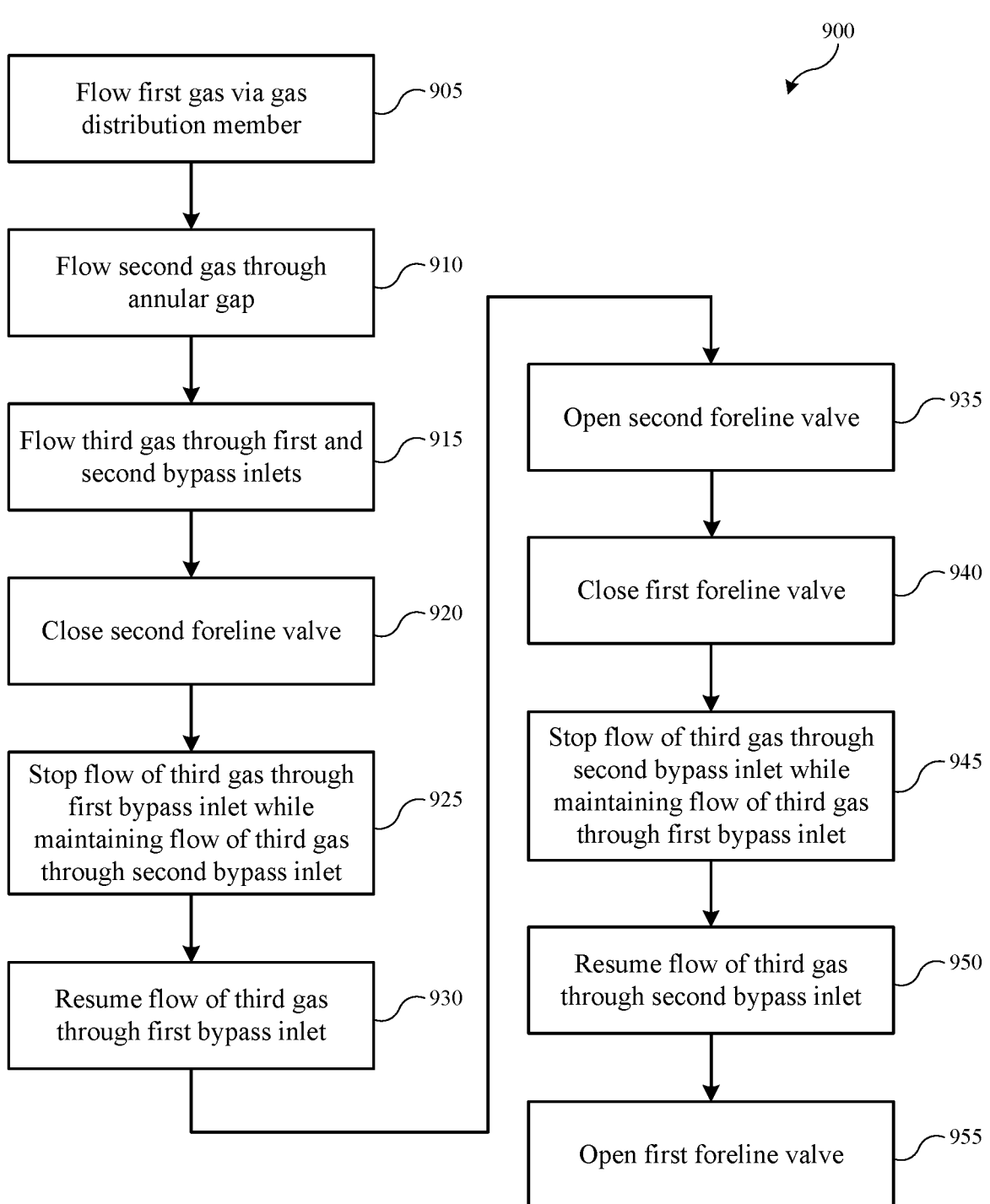
FIG. 9 shows exemplary operations in a method of cleaning chamber components of a processing chamber according to embodiments of the present technology.
Figures 10A, 10B:
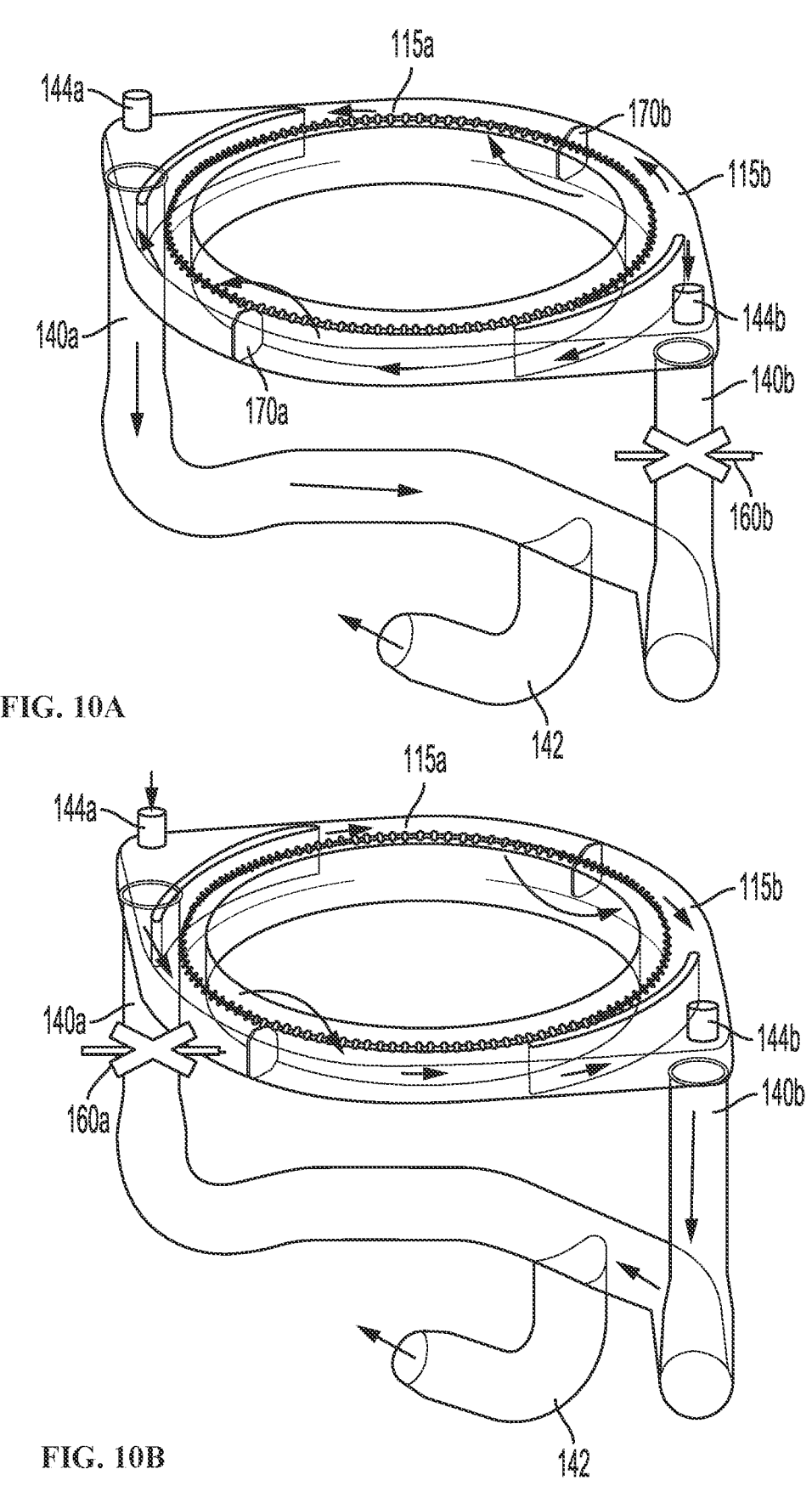
FIGS. 10A and 10B schematically illustrate flow volumes of a processing chamber while one or more operations of method of FIG. 9 may be performed.

FIG. 9 shows exemplary operations in a method 900 utilizing ex-situ cleaning to clean the processing chamber 100. FIGS. 10A and 10B schematically illustrate method 900. Specifically, FIGS. 10A and 10B schematically illustrate the flow volumes defined by the various chamber components. FIG. 10A schematically illustrates a right perspective view of the flow volumes while one or more operations of method 900 may be performed. FIG. 10B schematically illustrates the same perspective view of FIG. 10B while one or more other operations of method 900 may be performed. The various operations of method 900 may be performed in any order and may be removed or modified.

Method 900 may begin by, at operation 905, flowing a first or in-situ cleaning gas into the processing volume 106 via the gas distribution member 102, at operation 910, flowing a second gas through the annular gap surrounding the substrate support 104 in an upward direction toward the processing volume 106, and at operation 915, flowing a third or ex-situ gas into the internal volume 114 of the pumping liner 110 from the first and second bypass volumes 144*a*, 144*b* through the first and second bypass inlets, respectively. The first gas, the second gas, and third gas flowed during method 900 may be the same as the first gas 150, the second gas 152, and the third gas 154, respectively, flowed during method 400 described above. The flow rates of the first gas 150, the second gas 152, and the third gas 154 may be maintained at any of the flow rates as discussed above. Further, the operating pressure of the processing chamber 100 may be maintained at any pressure level or range as discussed above.

At operation 920, a valve 160*b* disposed along the foreline defining the second foreline volume 140*b* may be closed such that the flow through second foreline volume 140*b* may be prevented. The valve 160*b* may be equivalent to, the same as, or similar to the valve 160*a* disposed along the foreline defining the first foreline volume 140*a*. For purpose of description, the valve 160*a* and the valve 160*b* may be referred to as the first foreline valve 160*a* and the second foreline valve 160*b*, respectively.

At operation 925, flow of the third gas or the ex-situ cleaning gas from the first bypass volume 144*a* into the internal volume 114, or more specifically the first sub-volume 115*a*, through the first bypass gas inlet of the pumping liner 110 may be stopped by, e.g., closing a valve that may be placed upstream of the first bypass gas inlet and configured to control the flow of the ex-situ cleaning gas into the first bypass volume 144*a*. At operation 925, flow of the ex-situ cleaning gas from the second bypass volume 144*b* into the second sub-volume 115*b* through the second bypass gas inlet of the pumping liner 110 may be maintained.

Upon completion of operation 925, gas flow or fluid flow as shown in FIG. 10A may be achieved. Specifically, the ex-situ cleaning gas may be flowed into the second sub-volume 115*b* from the second bypass volume 144*b*. Due to the closure of the valve 160*b* and the presence of the choke plates 170*a*, 170*b*, the ex-situ cleaning gas may then enter into the processing volume 106 via half of the apertures 112 of the pumping liner 110, and then enter into the first sub-volume 115*a* via the other half of the apertures 112 of the pumping liner 110. The ex-situ cleaning gas may then flow toward the exhaust via the first foreline volume 140*a* and the exhaust volume 142. The flow of the ex-situ cleaning gas through the various flow volumes as shown in FIG. 10A may clean the pumping liner 110, the chamber components defining the processing volume 106, such as the gas distribution member 102 and the substrate support 104, and various other downstream ducts and chamber components exposed to the ex-situ cleaning gas flow. The flow of the ex-situ cleaning gas as shown in FIG. 10A may be maintained until the various chamber components may be sufficiently cleaned.

At operation 930, the flow of the ex-situ cleaning gas from the first bypass volume 144*a* into the internal volume 114, or more specifically the first sub-volume 115*a*, through the first bypass gas inlet of the pumping liner 110 may be resumed. At operation 935, the second foreline valve 160*b* may be opened, and at operation 940, the first foreline valve 160*a* may be closed to prevent fluid flow through the first foreline volume 140*a*.

At operation 945, the flow of the ex-situ cleaning gas from the second bypass volume 144*b* into the internal volume 114, or more specifically the second sub-volume 115*b*, through the second bypass gas inlet of the pumping liner 110 may be stopped by, e.g., closing a valve that may be placed upstream of the second bypass gas inlet and configured to control the flow of the ex-situ cleaning gas into the second bypass volume 144*b*. At operation 945, flow of the ex-situ cleaning gas from the first bypass volume 144*a* into the first sub-volume 115*a* through the first bypass gas inlet of the pumping liner 110 may be maintained.

Upon completion of operation 945, gas flow or fluid flow as shown in FIG. 10B may be achieved. Specifically, the ex-situ cleaning gas may be flowed into the first sub-volume 115*a* from the first bypass volume 144*a*. Due to the closure of the valve 160*a* and the presence of the choke plates 170*a*, 170*b*, the ex-situ cleaning gas may then enter into the processing volume 106 via half of the apertures 112 of the pumping liner 110, and then enter into the second sub-volume 115*b* via the other half of the apertures 112 of the pumping liner 110. The ex-situ cleaning gas may then flow toward the exhaust via the second foreline volume 140*b* and the exhaust volume 142. The flow of the ex-situ cleaning gas through the various flow volumes as shown in FIG. 10B may further clean the pumping liner 110, the chamber components defining the processing volume 106, such as the gas distribution member 102 and the substrate support 104, and various other downstream ducts and chamber components exposed to the ex-situ cleaning gas flow. The flow of the ex-situ cleaning gas as shown in FIG. 10B may be maintained until the various chamber components may be sufficiently cleaned.

Once the processing chamber 100 may be cleaned by performing some or all of the operations 905 to 945, at operation 950, the flow of the ex-situ cleaning gas from the first bypass volume 144*b* into the internal volume 114, or more specifically the first sub-volume 115*a*, through the second bypass gas inlet of the pumping liner 110 may be resumed. At operation 955, the first foreline valve 160*a* may be opened. The flow rate of the ex-situ cleaning gas, as well as the flow rates of the first and second gases, may be adjusted to appropriate levels as discussed above for carrying out deposition processes, or other appropriate levels for various other processes.

By performing one or more operations of method 900, chamber components downstream of the processing volume 106, as well as chamber components defining the processing volume 106, such as the gas distribution member 102 and the substrate support 104, may also be cleaned with the ex-situ cleaning gas delivered through the bypass inlets of the pumping liner 110. The ex-situ cleaning may be performed concurrently with the in-situ cleaning. Thus, the chamber components defining the processing volume 106, the chamber components upstream of the processing volume 106, and the chamber components downstream of the processing volume 106 may be cleaned simultaneously. The entire processing chamber 100 may be cleaned more efficiently as compared to utilizing in-site cleaning alone, thus may improve production throughout.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method for cleaning a processing chamber, the method comprising:

flowing a first gas through a gas distribution member of a processing chamber into a processing volume defined at least in part by the gas distribution member and a substrate support of the processing chamber;

flowing a second gas through a gas inlet of a pumping liner of the processing chamber into an internal volume of the pumping liner, wherein the pumping liner is disposed radially outward from the substrate support, and wherein the internal volume is in fluid communication with the processing volume via a plurality of apertures of the pumping liner circumferentially disposed about the processing volume;

flowing a portion of the second gas from the internal volume of the pumping liner into the processing volume through a first subset of apertures of the plurality of apertures while maintaining the flow of the first gas into the processing volume; and flowing the portion of the second gas from the processing volume into the internal volume of the pumping liner via a second subset of apertures of the plurality of apertures.

2. The method of claim 1, wherein the internal volume of the pumping liner comprises a first volume and a second volume separated by a pair of choke plates, wherein:

flowing the second gas through the gas inlet of the pumping liner into the internal volume of the pumping liner comprises flowing the second gas through the gas inlet of the pumping liner into the first volume;

flowing the portion of the second gas from the internal volume of the pumping liner into the processing volume comprises flowing the portion of the second gas from the first volume into the processing volume, wherein the portion of the second gas is distributed throughout an entirety of the processing volume; and flowing the portion of the second gas from the processing volume into the internal volume of the pumping liner comprises flowing the portion of the second gas from the processing volume into the second volume.

3. The method of claim 1, wherein the first gas is distributed throughout an entirety of the processing volume at a substantially uniform concentration.

4. The method of claim 1, wherein the first gas is flowed at a first flow rate, and wherein the second gas is flowed at a second flow rate greater than the first flow rate.

5. The method of claim 1, wherein the gas inlet is a first gas inlet, the method further comprising:

stop flowing the second gas through the first gas inlet of the pumping liner into the internal volume of the pumping liner;

flowing a third gas through a second gas inlet of the pumping liner into the internal volume of the pumping liner;

flowing a portion of the third gas from the internal volume of the pumping liner into the processing volume through the second subset of apertures of the plurality of apertures; and flowing the portion of the third gas from the processing volume into the internal volume of the pumping liner via the first subset of apertures of the plurality of apertures.

6. The method of claim 1, further comprising flowing a third gas through an annular gap surrounding the substrate support in an upward direction toward the processing volume.

7. The method of claim 1, wherein flowing the second gas through the gas inlet of the pumping liner into an internal volume of the pumping liner, bypasses the gas distribution member.

8. The method of claim 1, further comprising flowing a portion of the second gas from the internal volume of the pumping liner directly into a first foreline volume, a second foreline volume, or both a first foreline volume and a second foreline volume.

9. The method of claim 8, further comprising a flow control mechanism, and operating the flow control mechanism to direct the flow of the second gas into the first foreline volume, the second foreline volume, or both the first foreline volume and the second foreline volume.

10. The method of claim 8, wherein the pumping liner comprises a first laterally extending liner portion and a first toroidally shaped liner portion.

11. The method of claim 10, further comprising flowing the portion of the second gas through at least a portion of the first laterally extending liner portion and at least a portion of the first toroidally shaped liner portion, and into the first foreline volume, the second foreline volume, or both the first foreline volume and the second foreline volume.

12. The method of claim 10, wherein the pumping liner further comprises a second laterally extending liner portion and a second toroidally shaped liner portion, and further comprising flowing the portion of the second gas through at least a portion of the second laterally extending liner portion and at least a portion of the second toroidally shaped liner portion, and into the first foreline volume, the second foreline volume, or both the first foreline volume and the second foreline volume.

13. A deposition method, comprising:
  flowing a first gas through a gas distribution member of a processing chamber into a processing volume defined at least in part by the gas distribution member and a substrate support of the processing chamber supporting a semiconductor substrate thereon; and
  flowing a second gas through a gas inlet of a pumping liner of the processing chamber into an internal volume of the pumping liner, wherein the pumping liner is disposed radially outward from the substrate support, wherein the internal volume of the pumping liner is in fluid communication with the processing volume via a plurality of apertures circumferentially disposed about the processing volume, wherein the first gas is flowed at a first flow rate, wherein the second gas is flowed at a second flow rate less than the first flow rate such that the first gas is flowed from the processing volume into the internal volume of the pumping liner via the plurality of apertures while the flow of the second gas into the processing volume is substantially prevented, and wherein a pressure difference between two peripheral locations inside the processing volume is less than 0.001 torr.

14. The deposition method of claim 13, wherein the gas inlet is a first gas inlet, the deposition method further comprising:
  flowing a third gas through a second gas inlet of the pumping liner into the internal volume of the pumping liner, wherein the first gas inlet and the second gas inlet are diametrically opposed from each other, wherein the third gas is flowed at a third flow rate less than the first flow rate such that the flow of the third gas into the processing volume is substantially prevented, and wherein the flow of the first gas, the flow of the second gas, and the flow of the third gas collectively create an axially symmetrical pressure profile inside the processing volume about a central axis of the processing volume.

15. The deposition method of claim 13, further comprising flowing a third gas through an annular gap surrounding the substrate support in an upward direction toward the processing volume.

16. A method for cleaning a processing chamber, the method comprising:
  flowing a first gas through a gas distribution member of a processing chamber into a processing volume defined at least in part by the gas distribution member and a substrate support of the processing chamber; and
  flowing a second gas through a gas inlet of a pumping liner of the processing chamber directly into an internal volume of the pumping liner, wherein the pumping liner is disposed radially outward from the substrate support, and wherein the internal volume is in fluid communication with the processing volume via a plurality of apertures of the pumping liner circumferentially disposed about the processing volume;
  wherein the pumping liner comprises a first laterally extending liner portion and a first toroidally shaped liner portion.

17. The method of claim 16, further comprising flowing the portion of the second gas through at least a portion of the first laterally extending liner portion and at least a portion of the first toroidally shaped liner portion, and into a first foreline volume, a second foreline volume, or both a first foreline volume and a second foreline volume.

18. The method of claim 17, wherein the pumping liner further comprises a second laterally extending liner portion and a second toroidally shaped liner portion, and further comprising flowing the portion of the second gas through at least a portion of the second laterally extending liner portion and at least a portion of the second toroidally shaped liner portion, and into the first foreline volume, the second foreline volume, or both the first foreline volume and the second foreline volume.

19. The method of claim 16, wherein flowing the second gas through the gas inlet of the pumping liner into an internal volume of the pumping liner, bypasses the gas distribution member.

20. The method of claim 16, further comprising flowing a portion of the second gas from the internal volume of the pumping liner directly into a first foreline volume, a second foreline volume, or both a first foreline volume and a second foreline volume.

* * * * *